United States Patent [19]

Takashima

[11] Patent Number: 5,541,885
[45] Date of Patent: Jul. 30, 1996

[54] HIGH SPEED MEMORY WITH LOW STANDBY CURRENT

[75] Inventor: Daisaburo Takashima, Kawasaki, Japan

[73] Assignee: Kabushiki Kaisha Toshiba, Kawasaki, Japan

[21] Appl. No.: 397,757

[22] Filed: Mar. 7, 1995

Related U.S. Application Data

[63] Continuation of Ser. No. 177,397, Jan. 5, 1994, abandoned.

[30] Foreign Application Priority Data

Jan. 12, 1993 [JP] Japan ..................................... 5-003011

[51] Int. Cl.$^6$ ..................................................... G11C 11/40
[52] U.S. Cl. ........................... 365/226; 365/229; 365/208; 365/227
[58] Field of Search ..................................... 365/226, 227, 365/229, 182, 189.09, 184, 205, 207, 208

[56] References Cited

U.S. PATENT DOCUMENTS

| 4,983,861 | 1/1991 | Kikuchi et al. | 365/226 |
| 5,124,574 | 6/1992 | Ibaraki | 365/226 |
| 5,166,902 | 11/1992 | Silver | 365/182 |
| 5,200,921 | 4/1993 | Okajima | 365/226 |

OTHER PUBLICATIONS

IEEE Journal of Solid–State circuits vol. 27, No. 5, Akinori Sekiyama, et al., "A 1–V Operating 256–kb Full–CMOS SRAM", May, 1992, pp. 776–782.

*Primary Examiner*—Tan T. Nguyen
*Attorney, Agent, or Firm*—Oblon, Spivak, McClelland, Maier & Neustadt, P.C.

[57] ABSTRACT

A semiconductor device, having an active operation mode wherein a large amount of current is consumed and a standby operation mode wherein a very small amount of current is consumed, comprises p-channel and n-channel MOS transistors, each having a source or drain as a connection node fixed to an "H" or "L" level in the standby operation mode. In the MOS transistors of the same channel, the threshold voltages $V_{T1}$ and $V_{T4}$ of transistors $Q_1$ and $Q_4$, which are cut off in the standby operation mode, are set to a level higher than the threshold voltages $V_{T2}$ and $V_{T3}$ of transistors $Q_2$ and $Q_3$, which are turned on in the standby operation mode ($V_{T1} > V_{T2}$, $|V_{T4}| > |V_{T3}|$).

18 Claims, 10 Drawing Sheets

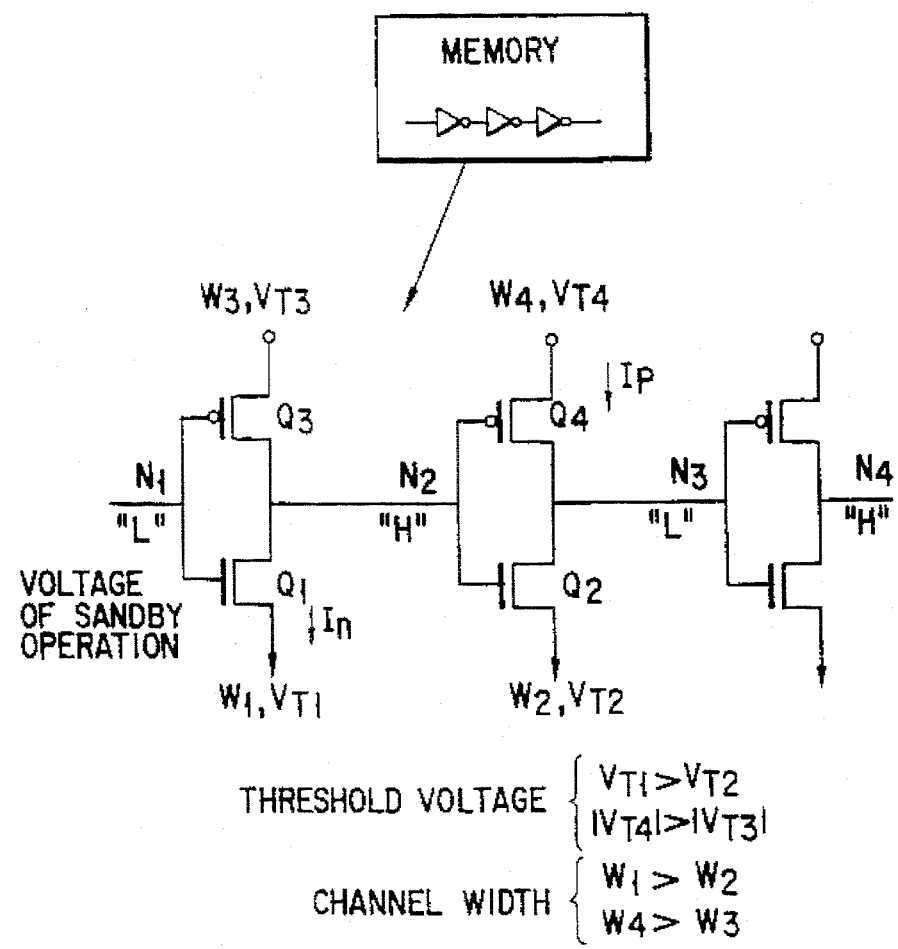
$$\text{THRESHOLD VOLTAGE} \begin{cases} V_{T1} > V_{T2} \\ |V_{T4}| > |V_{T3}| \end{cases}$$
$$\text{CHANNEL WIDTH} \begin{cases} W_1 > W_2 \\ W_4 > W_3 \end{cases}$$
F I G. 4

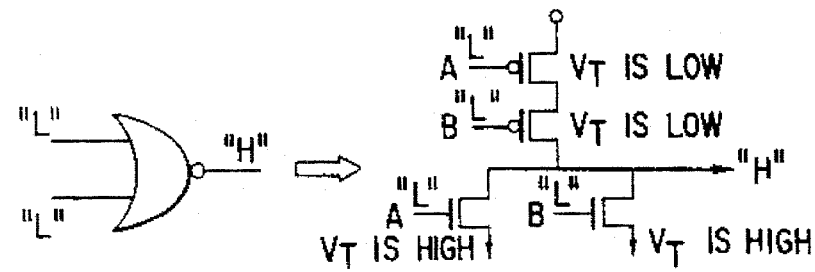
F I G. 8A
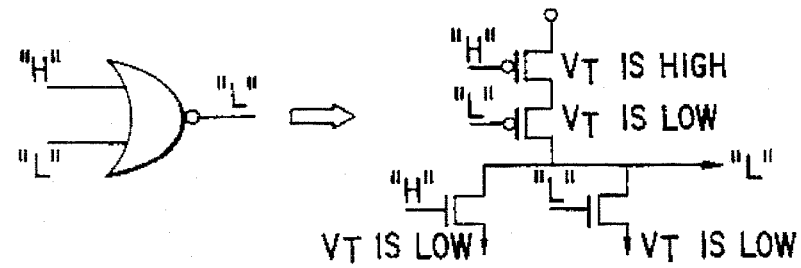
F I G. 8B
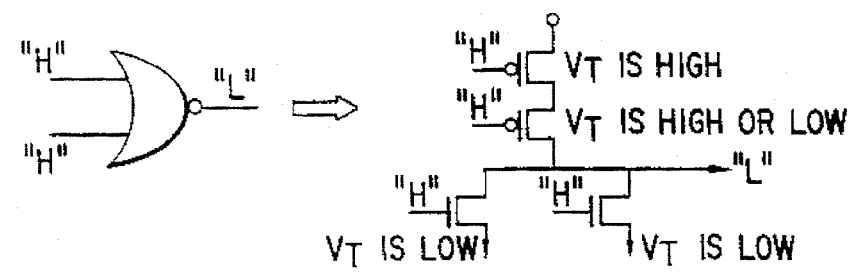
F I G. 8C
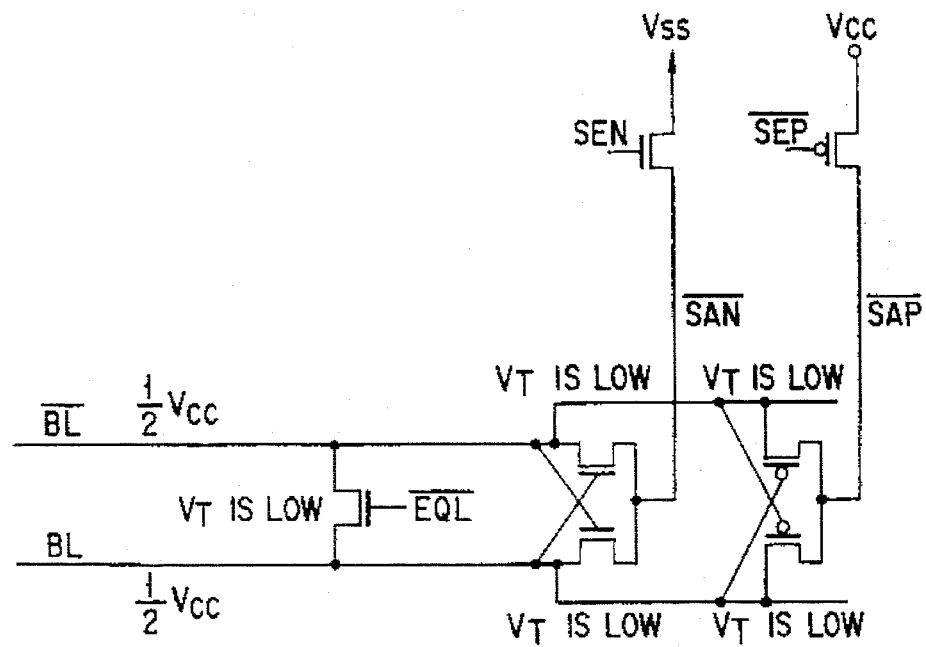
F I G. 9

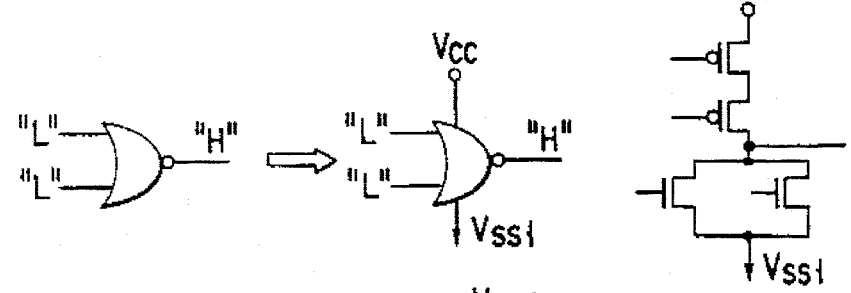
F I G. 16A
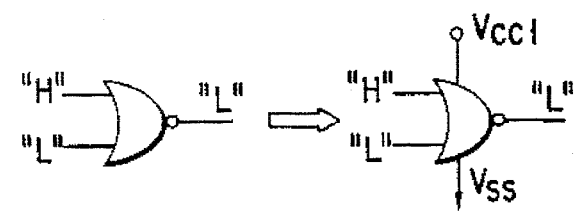
F I G. 16B
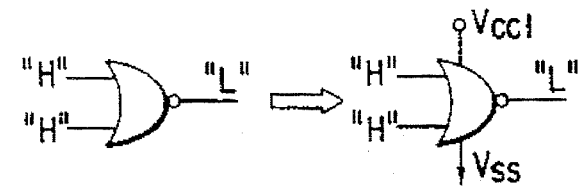
F I G. 16C
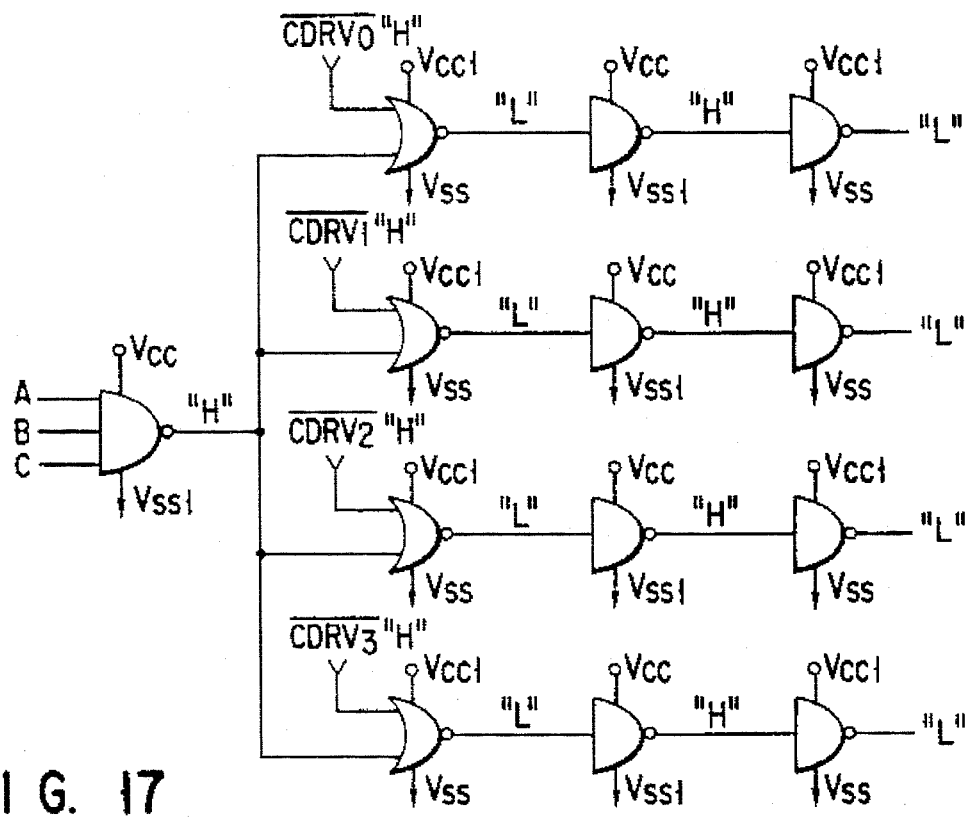
F I G. 17

HIGH SPEED MEMORY WITH LOW STANDBY CURRENT

This application is a continuation of application Ser. No. 08/177,397, filed on Jan. 5, 1994, now abandoned.

BACKGROUND OF THE INVENTION

1. Field of the Invention

The present invention relates to a semiconductor device having an active operation mode wherein a large amount of current is consumed and a standby operation mode wherein a very small amount of current is consumed, and more particularly to a semiconductor device driven by a low voltage.

2. Description of the Related Art

Recently, as a DRAM or an LSI has been highly integrated and power consumption of a semiconductor device has been reduced to allow battery driving, an internal source voltage (hereinafter referred to simply as "first voltage") $V_{CC}$ has become lower and lower. As apparent from, FIG. 1A, the internal source voltage against generation of DRAM has becomes lower. For example, in a 1 G or 4 G-bit DRAM, the first voltage $V_{CC}$ is reduced as low as 1.5 V to 1.0 V. A battery-driven LSI is required to be driven at a voltage as low as 1.5 V to 0.8 V.

However, since in an LSI a MOS transistor has a threshold voltage $V_T$, operation speed or gate delay time is suddenly reduced, when the first voltage $V_{CC}$ is increased near the threshold voltage $V_T$. This phenomenon is shown in FIG. 1B. If the threshold voltage is lowered to prevent the sudden reduction of gate delay time, a standby current is greatly increased.

FIG. 2 shows a part of circuit in a memory according to the conventional art; and shows three stage inverter circuits. With the circuit of FIG. 2, in a standby state, nodes $N_1$ and $N_3$ are set at an "L" level and nodes $N_2$ and $N_4$ are set at an "H" level. In this standby state, a leak current I leak flows on the two inverters of the former stages via transistors $Q_1$ and $Q_4$. Since this phenomenon occurs throughout the memory, the leak current is greatly increased when the threshold voltage of the transistors is low.

FIG. 1C is a diagram showing the relationship between the threshold voltage $V_T$ of a transistor and the standby current of a 16M bit DRAM level chip. According to FIG. 1C, a threshold voltage of at least 0.6 V is required to suppress the standby current to 1 μA.

FIGS. 3A and 3B show the change of the current flowing through a SRAM and a DRAM in the active state and the standby state. In FIGS. 3A and 3B, a current in the active state is indicated as $I_{CC1}$ and a current in the standby state is indicated as $I_{CC2}$. Normally, the memory is set in the standby state, when data is not accessed, in order to reduce the current flowing therein. However, since the standby period is much longer than the active period, it is necessary to reduce the current $I_{CC2}$ in the standby state to a sufficiently low level. The standby state determines the current flowing through a memory when the memory is not operated by a battery backup.

As described above, in a conventional semiconductor device, when the first voltage $V_{CC}$ of an LSI is lowered, the operation speed or gate delay time is lowered as the first voltage $V_{CC}$ approaches the threshold voltage $V_T$. And when the threshold voltage $V_T$ is lowered, the standby current is increased.

SUMMARY OF THE INVENTION

An object of the present invention is to provide a semiconductor device which can be operated at a high speed, even when the internal source voltage is lowered and a standby current is suppressed to a low level.

The subject matter of the present invention is to variably set the threshold voltage $V_T$ of an MOS transistor, a first voltage $V_{CC}$ and an internal source voltage (hereinafter referred to as a second voltage) $V_{SS}$ in the standby operation mode, in order to achieve contradictory objects, i.e., to reduce the current consumption in the standby state and to maintain a high speed operation.

According to a first aspect of the present invention, there is provided a semiconductor device having an active operation mode and a standby operation mode, said semiconductor device comprising:

a plurality of p-channel MOS transistors and n-channel MOS transistors, each having a source and a drain, one of the source and the drain of each of the p-channel MOS transistors and the n-channel transistors being fixed to one of potentials of "H" level and "L" level in the standby operation mode; wherein a threshold voltage of a first MOS transistor selected from the p-channel and the n-channel MOS transistors, which is cut off in the standby operation mode, at a value higher than a threshold voltage of a second MOS transistor selected from the p-channel and n-channel MOS transistors and being same channel as the first MOS transistor, the second MOS transistor being turned on in the standby operation mode.

As regards the first aspect of the present invention, it is desirable that the first MOS transistor have a channel width smaller than that of the second MOS transistor.

It is also desirable that:

at least one of the p-channel and the n-channel MOS transistors be connected in series;

when the MOS transistors connected in series are cut off in the standby operation mode, the setting means include means for setting at least one of the MOS transistors connected in series at a high value; and a circuit obtained by connecting the p-channel and n-channel MOS transistors constitute at least one of a NOR circuit and a NAND circuit.

According to the first aspect of the present invention, in which the threshold voltages of a transistor (OFF transistor) which is cut off in the standby operation mode and a transistor (ON transistor) which is turned on in the standby operation mode are set as described above, the following advantages are obtained. For example, the threshold voltage of an ON transistor is lowered without changing the threshold voltage of an OFF transistor, thereby increasing an operation speed without increasing a leak current in the standby operation mode.

When a semiconductor device is driven by a low voltage, if the threshold voltages of both the transistors are lowered, a leak current in a standby operation is disadvantageous to increase of the operation speed. However, if the threshold voltage of the OFF transistor is set at a high level which can decrease the standby current and the threshold voltage of the ON transistor is set at a low level which may not greatly increase the current in an active operation, it is possible to increase the operation speed, while suppressing the standby current.

Further, since the channel width of a transistor having a low threshold voltage is narrow and the channel width of a transistor having a high threshold voltage is wide, the gate delay of switching the standby operation mode to the active operation mode can be the same as that of switching the active operation mode to the standby operation mode. Thus, the operation speed of an overall LSI can be increased.

According to a second aspect of the present invention, there is provided a semiconductor device having an active operation mode and a standby operation mode, said semiconductor device comprising:

a plurality of p-channel MOS transistors and n-channel MOS transistors, each having a source and a drain, one of the source and the drain of each of the p-channel MOS transistors and the n-channel transistors being fixed to one of potentials of "H" level and "L" level in the standby operation mode;

first means for lowering the voltage of a second power source connected to a p-channel MOS transistor which is cut off in the standby operation mode to a level lower than the voltage of a first power source connected to a p-channel MOS transistor which is kept on in the standby operation mode; and second means for raising the voltage of a fourth power source connected to an n-channel MOS transistor which is cut off in the standby operation mode to a level higher than the voltage of a third power source connected to an n-channel MOS transistor which is kept on in the standby operation mode.

In this case, the semiconductor device is characterized by further comprising means for maintaining the voltage of the first power source connected to the p-channel MOS transistor which is kept on in the standby operation mode and the voltage of the third power source connected to the n-channel MOS transistor which is kept on in the standby operation mode.

As regards the first aspect of the present invention, it is desirable that:

at least one of the p-channel and the n-channel MOS transistors be connected in series, thereby forming a serially-connected transistor circuit;

the voltages of the first and second power source be applied to both ends of the serially-connected transistor circuit; and further comprises third means for lowering the voltage of the first power source and raising the voltage of the third power source, when the serially-connected transistor circuit is cut off in the standby operation mode.

It is also desirable that the serially connected transistor circuit constitutes at least one of a NOR circuit and a NAND circuit.

It is also desirable that the semiconductor device comprise a plurality of core circuits including a plurality of memory cells each constituted by p-channel and n-channel MOS transistors, and fourth means for maintaining the voltages of the second power source connected to the p-channel MOS transistor which is cut off in the active operation mode and the fourth power source connected to the n-channel MOS transistor which is cut off in the standby operation mode to the same potential as the voltages of the first and the third power sources in the standby operation mode, in a core circuit which is not selected in the active operation mode.

The above semiconductor device preferably further comprise input means for inputting a signal from an external device, wherein a core circuit for setting the voltages of the second and the fourth power sources to the same level as those of the first and the third power sources in the active operation mode is selected by an address indicated by the signal input by the input means.

According to the second aspect of the present invention, the value of the second voltage $V_{SS}$ connected to an nMOS transistor which is cut off when an input is of "L" level in the standby operation mode is increased, and a gate input is maintained at the "L" level. In this state, the gate-source voltage is a negative potential. Thus, even if the threshold voltage of the nMOS transistor is lowered, the cut-off characteristics can be greatly improved and leak current can be suppressed.

The value of the first voltage $V_{CC}$ connected to an nMOS transistor which is cut off when an input is of "H" level in the standby operation mode is also increased, and a gate input is maintained at the "H" level. In this state, the gate-source voltage is a negative potential. Thus, even if the threshold voltage of the pMOS transistor is lowered, the cut-off characteristics can be greatly improved and leak current can be suppressed.

As described above, the threshold voltage of a MOS transistor which is cut off in the standby operation mode can be lowered, thereby ensuring a high speed operation, even if the potential of the first voltage $V_{CC}$ is lower than in the conventional device. Further, it is possible to suppress a leak current in the standby operation mode.

According to the present invention, the threshold voltage of an MOS transistor, the first voltage $V_{CC}$ and the second voltage $V_{SS}$ in the standby operation mode are variably set, thereby achieving contradictory objects, i.e., to reduce the current consumption in the standby state and to maintain a high speed operation. Thus, it is possible to provide a semiconductor device which is operated at a high speed, even when the internal voltage is low and a standby current is suppressed to a low level.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a diagram showing a logic gate of part of a memory circuit according to a first embodiment of the present invention;

FIGS. 8A to 8C are diagrams showing an example in which the first embodiment of the present invention is applied to a NOR circuit;

FIG. 9 is a diagram showing an example in which the first embodiment of the present invention is applied to a DRAM;

FIGS. 16A to 16C are diagrams showing an example in which the second embodiment of the present invention is applied to a NOR circuit; and FIG. 17 is a diagram showing an example in which the second embodiment of the present invention is applied to a column decoder of a DRAM.

DETAILED DESCRIPTION OF THE PREFERRED EMBODIMENTS

Embodiments of the present invention will be described with reference to the accompanying drawings.

FIG. 4 is a diagram showing a logic gate which is used as a part of a memory circuit according to a first embodiment of the present invention, i.e., three-stage inverter circuits. The logic gate is three-stage inverter circuit which comprise three inverter having p-channel MOS transistor and n-channel MOS transistor and being connected in series.

Figure 2:
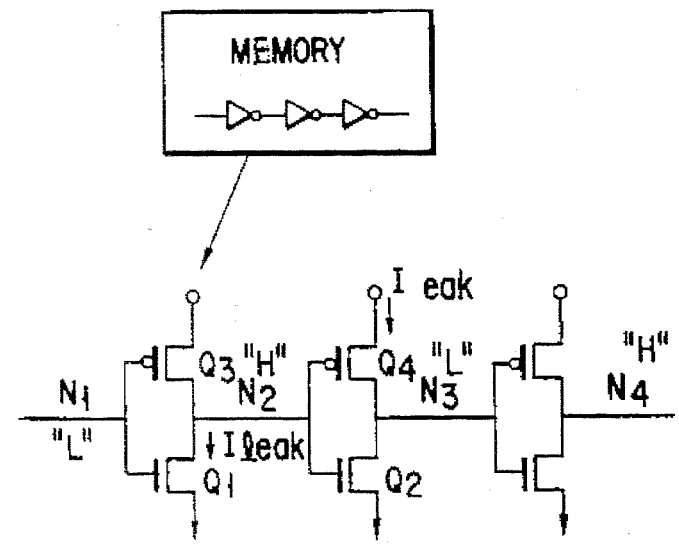
FIG. 2 is a diagram showing a configuration of a conventional inverter circuit.

The memory circuit has an active operation mode and a standby operation mode as shown in FIG. 2. In the standby operation mode, most of the circuits in a memory chip have constant values. In other words, the nodes are set at either an "H" level first voltage $V_{CC}$ or an "L" level second voltage $V_{SS}$.

In FIG. 4, nodes $N_1$ and $N_3$ are set at the "L" level and nodes $N_2$ and $N_4$ are set at the "H" level. In the inverters of the first and the second stages, if threshold voltages $V_{T1}$ and $V_{T4}$ of cut-off transistors $Q_1$ and $Q_4$, to which the first voltage $V_{CC}$ applied between the source and the drain, are maintained at a high level (equal to the conventional threshold voltage), the standby current can be suppressed to 1 µA, for example. Even if the threshold voltages $V_{T2}$ and $V_{T3}$ of turned-on transistors $Q_2$ and $Q_3$, in which the source-drain voltage is 0 V, are lowered, the standby current is not increased.

Figure 1A:
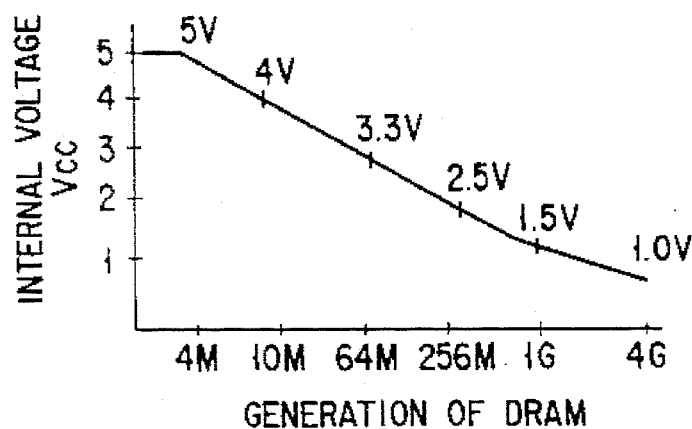
FIGS. 1A to 1C are diagrams for explaining problems of a conventional semiconductor device.
Figure 1B:
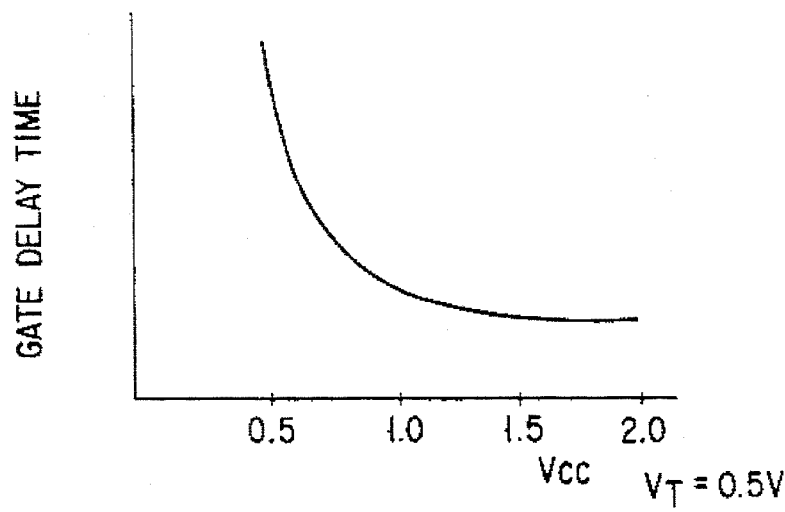
Figure 1C:
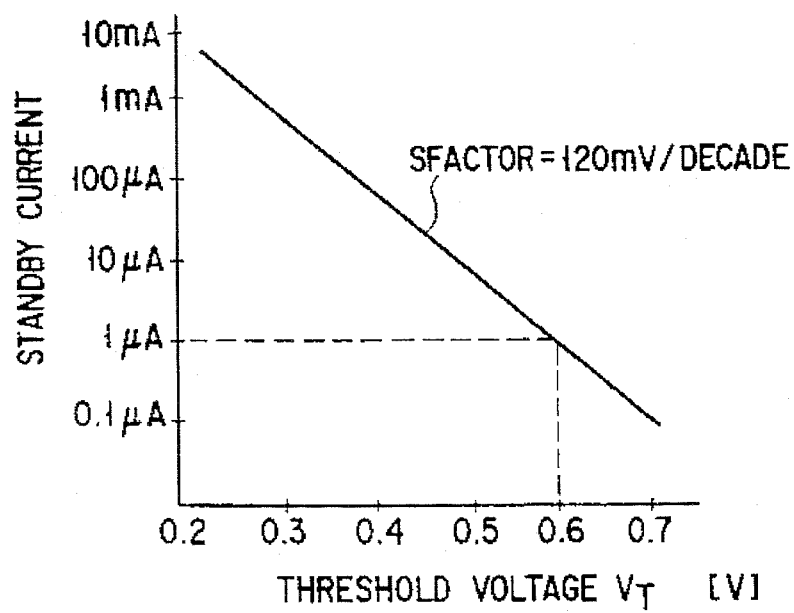
Figure 3A:
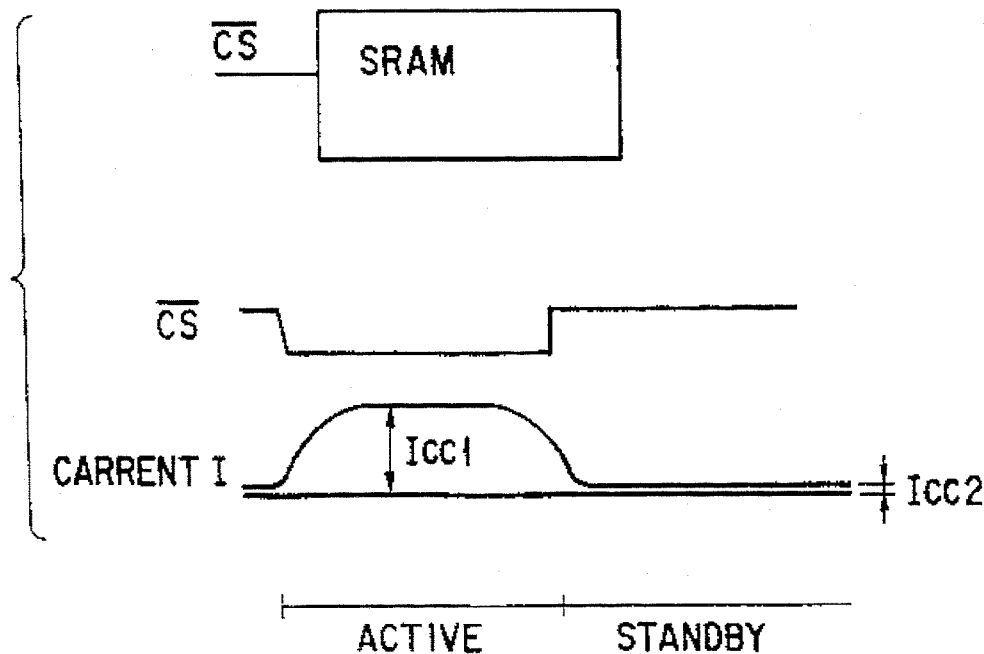
FIGS. 3A and 3B are diagrams showing the change of the current flowing through conventional SRAM and DRAM in the active state and the standby state.
Figure 3B:
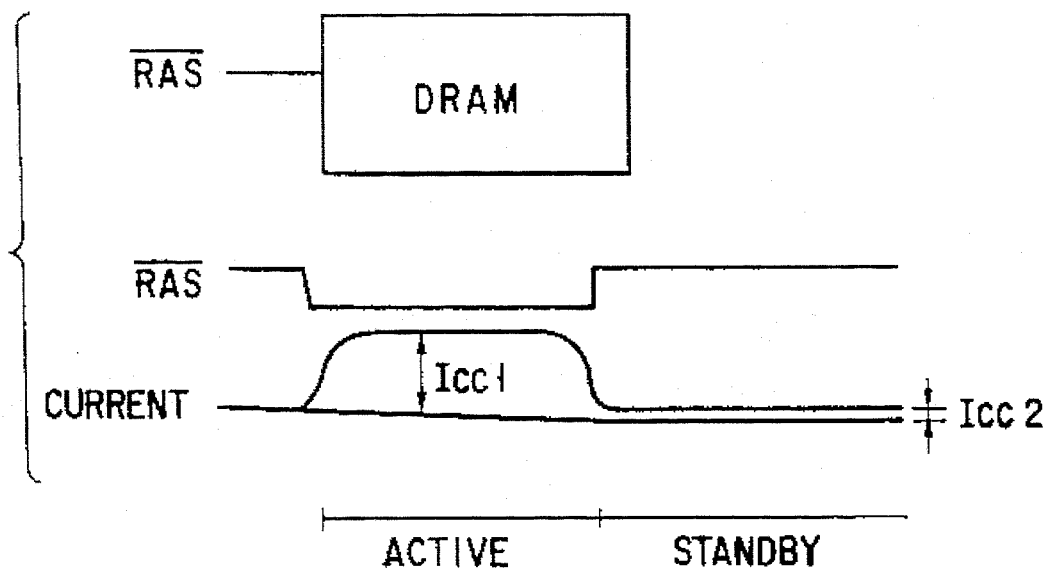

For the above reasons, the threshold voltages $V_{T2}$ and $V_{T3}$ can be lowered without increasing leak current in a standby operation. When the threshold voltages $V_{T2}$ and $V_{T3}$ are lowered, leak current of the transistors in an active operation is increased. However, as shown in FIG. 3, since the amount of an active current in the memory is considerably great, i.e., several tens to several hundreds of mA, the leak current is negligible. For example, if a leak current of 1 mA is allowed, the threshold voltages $V_{T2}$ and $V_{T3}$ can be as low as 0.3 V, as shown in FIG. 1C. Similarly, if the leak current for the threshold voltages $V_{T1}$ and $V_{T4}$ is 1 µA, the threshold voltage of 0.6 V is required. Thus, the difference between $V_{T1}$ and $V_{T2}$ is equal to the difference between $V_{T4}$ and $V_{T3}$, i.e., 0.3 V ($V_{T1}-V_{T2}$=0.3 V, $|V_{T4}|-|V_{T3}|$=0.3 V, namely, $V_{T1}>V_{T2}$, $|V_{T4}|>|V_{T3}|$.

Figure 5A:
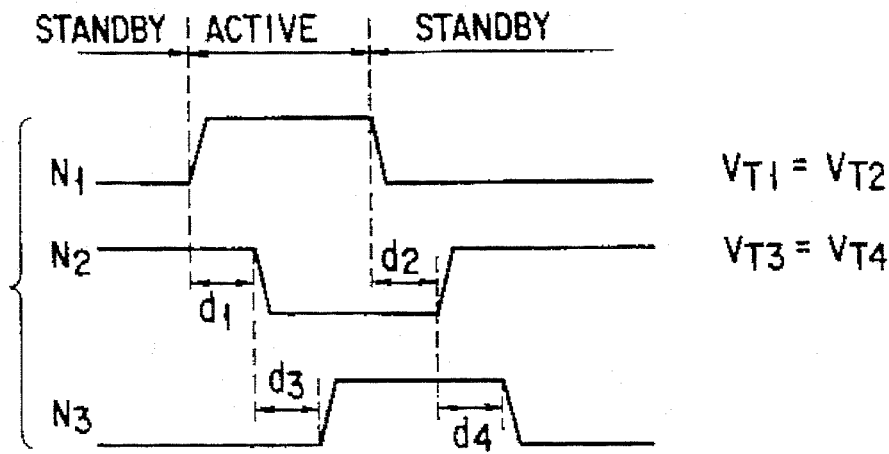
FIGS. 5A to 5C are diagrams illustrating gate delay for comparison of the conventional and the first embodiment.
Figure 5B:
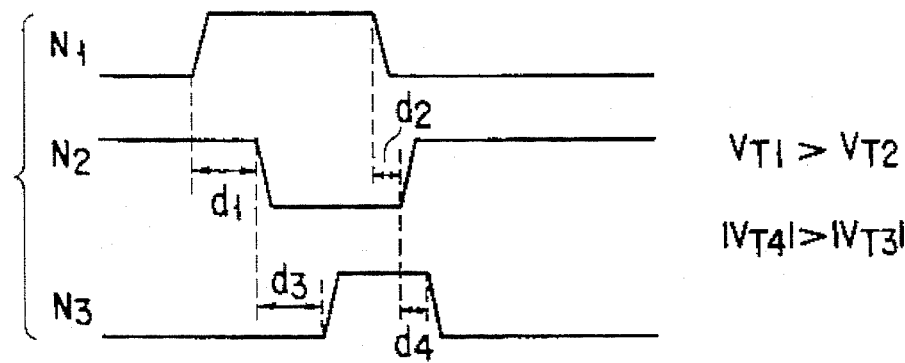
Figure 5C:
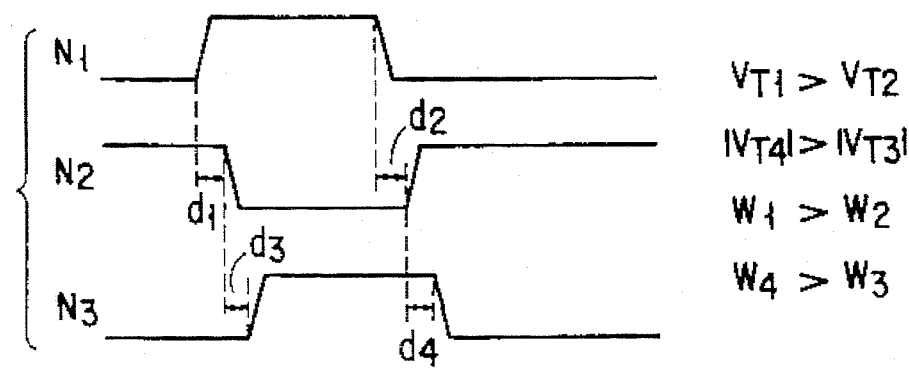

Gate delays as described in the case above are shown in FIGS. 5A to 5C. FIG. 5A shows a gate delay in a conventional device wherein all the threshold voltages $V_T$ are high ($V_{T1}=V_{T2}=V_{T3}=V_{T4}$), and FIGS. 5B and 5C show gate delays in the first embodiment.

In FIG. 5B, delays $d_1$ and $d_3$ are of the same amount as in the conventional device, whereas delays $d_2$ and $d_4$ are smaller, since the threshold voltages $V_{T3}$ and $V_{T3}$ are lowered. Thus, an active operation can be switched to a standby operation at a higher speed.

In the transistors $Q_2$ and $Q_3$ having the lower threshold voltage, which are operated at a high speed, channel widths $W_2$ and $W_3$ are reduced in order to lower the speed by an amount corresponding to the increased speed of the operation of the transistors $Q_2$ and $Q_3$. The reduced amount of channel width $\Delta W$ is distributed to the transistors $Q_1$ and $Q_4$ having the higher threshold voltage, which are operated at a low speed, thereby increasing channel width $W_1$ and $W_4$ in order to increase the operation speed of the transistors $Q_1$ and $Q_4$.

In summary, if $W_1$ is greater than $W_2$, and $W_4$ is greater than $W_3$ ($W_1>W_2$, $W_4>W_3$), all the delays $d_1$, $d_2$, $d_3$ and $d_4$ shown in FIG. 5C can be smaller than the delays $d_1$, $d_2$, $d_3$ and $d_4$ shown in FIG. 5A, thereby increasing the operation speed, under a minimum first voltage $V_{CC}$.

Figure 6:
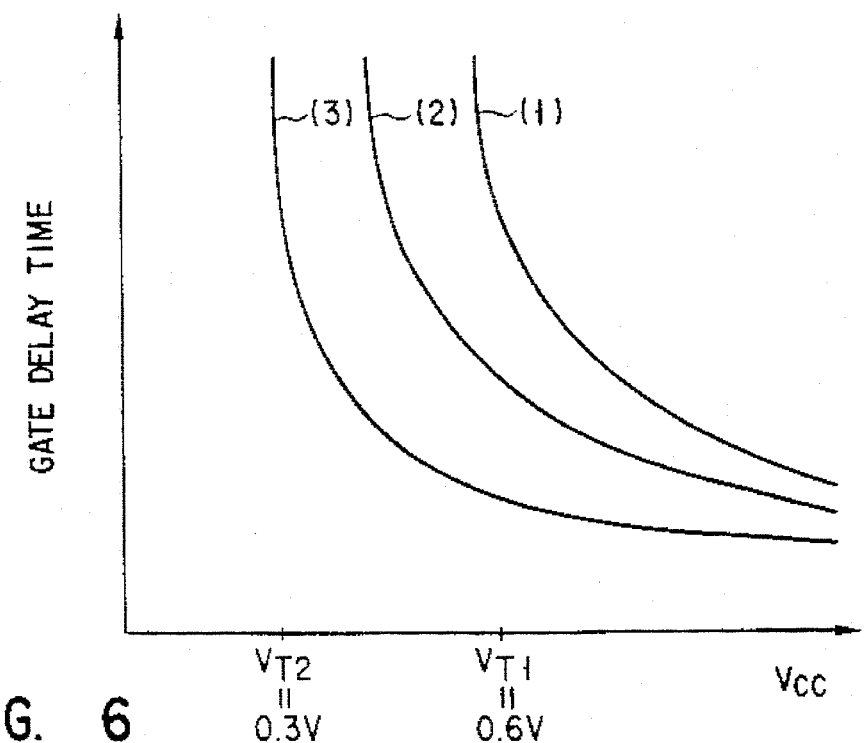
FIG. 6 is a diagram for explaining a gate delay time under a minimum first voltage $V_{CC}$ according to the first embodiment.

FIG. 6 is a diagram for explaining a gate delay time under a minimum first voltage $V_{CC}$ according to the first embodiment. In FIG. 6, a curve (1) represents the gate delay in a case where the threshold voltage $V_T$ is 0.6 V in the conventional device. A curve (3) represents the gate delay in a case where the threshold voltage $V_T$ is 0.3 V, in which case, the standby current is increased. In the first embodiment, the threshold voltages $V_T$ of 0.3 V and 0.6 V are applied to both a pMOS and an nMOS. If the channel widths of the conventional transistors $Q_1$, $Q_2$, $Q_3$ and $Q_4$ are set as $W_1=W$, $W_2=W$, $W_3=2W$ and $W_4=2W$, and the operation speed of the transistors $Q_1$ and $Q_4$ having the threshold voltage $V_T$ of 0.6 V under the minimum first voltage $V_{CC}$ is K times as high as that of the transistors $Q_2$ and $Q_3$ having the threshold voltage $V_T$ of 0.3 V, $W_1$ to $W_4$ of the first embodiment are determined as follows:

$$W_1 = 2KW/(K+1)$$

$$W_2 = 2W/(K+1)$$

$$W_3 = 4W/(K+1)$$

$$W_4 = 4KW/(K+1)$$

where $W_1/W_2=K$ and $W_4/W_3=K$. Thus, the channel widths of the transistors $Q_1$ and $Q_4$ are K times those of the transistors $Q_2$ and $Q_3$, respectively, so that the operation speed for switching the active operation to the standby operation can be the same as that for switching the standby operation to the active operation.

In this case, the delay for switching the standby operation mode to the active operation mode is (K+1)/2KW+{(K+1)/4KW}×2 in the first embodiment, and (1/W)+(½W)×2 in the conventional device. Thus, the operation speed of the first embodiment is 2K/(K+1) times as high as that of the conventional device.

The delay for switching the active operation mode to the standby operation mode is {(K+1)/2W}×(1/K)+{(K+1)/4W}×(1/K)×2 in the first embodiment of the present invention, and (1/W)+(½W)×2 in the conventional device. Thus, the operation speed of the first embodiment is 2K/(K+1) times as high as that of the conventional device, as proven in the above case.

Assuming that the conventional delay is 1, the delay of all the transistors having the threshold voltage $V_T$ of 0.3 V is 1/K and the delay according to the first embodiment is (K+1)/2K, i.e., the median value of 1 and 1/K ({1+(1/K)}/2=(K+1)/2K). In FIG. 5, a curve (2) representing the delay in the first embodiment is located between the curves (1) and (3).

As described above, according to the first embodiment, since the threshold voltages $V_{T1}$ and $V_{T4}$ of the transistors $Q_1$ and $Q_4$ (which are cut off in the standby operation mode) are maintained, a leak current in the standby operation mode can be lowered. Since a large amount of active current flows in the active mode, the threshold voltages $V_{T2}$ and $V_{T3}$ of the transistors $Q_2$ and $Q_3$ (which are turned on in the standby operation mode) can be lower than the active current. Hence, the threshold voltages $V_{T2}$ and $V_{T3}$ can be set to low values. Consequently, the gate delay time in switching the active operation mode to the standby operation mode can be greatly reduced, with the result that the operation speed can be increased with a low first voltage $V_{CC}$. In other words, the operation speed can be increased without increasing a leak current in the standby mode.

The low threshold voltage transistors $Q_2$ and $Q_3$ have smaller channel widths, and the high threshold voltage transistors $Q_1$ and $Q_4$ have larger channel widths. With this constitution, the gate delay of switching the standby operation mode to the active operation mode can be same as the gate delay of switching the active operation mode to the standby operation mode, thereby increasing the operation speed of the entire LSI.

FIGS. 7A to 7C and FIGS. 8A to 8C are diagrams showing examples in which the first embodiment of the present invention is applied to a NAND circuit and a NOR circuit, respectively.

Figure 7A:
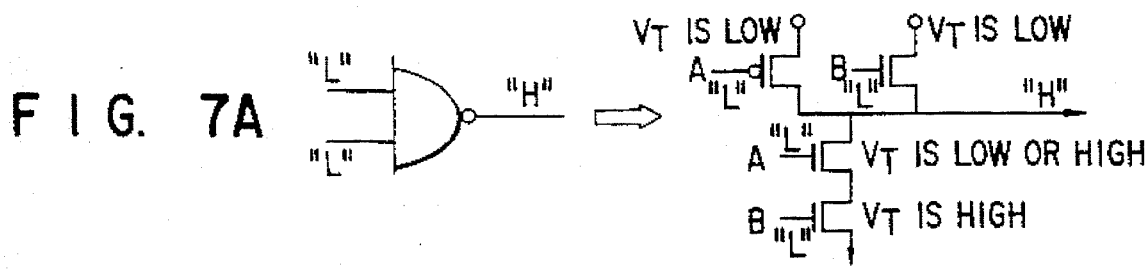
FIGS. 7A to 7C are diagrams showing an example in which the first embodiment of the present invention is applied to a NAND circuit.
Figure 7B:
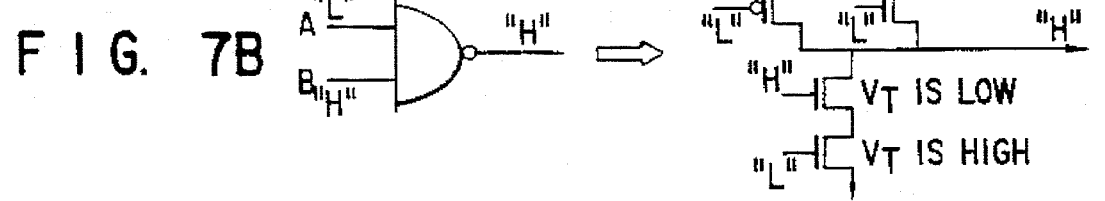
Figure 7C:
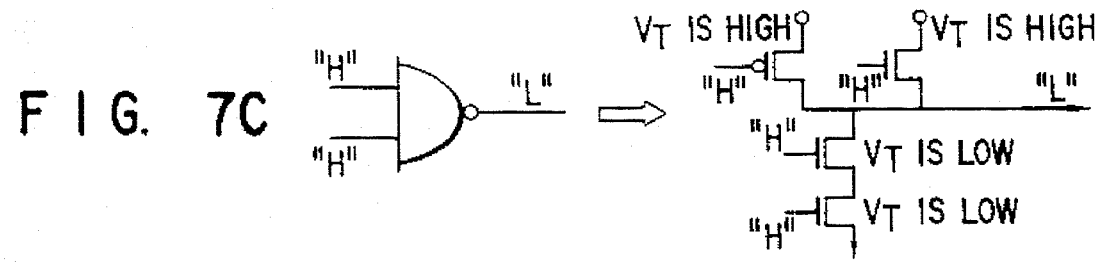

In a NAND circuit, when an output is of "H" level in the standby operation mode as shown in FIGS. 7A and 7B, the threshold voltage $V_T$ of an nMOS transistor which is cut off in the standby operation mode is set at a high level. In contrast, when an output is of "L" level in the standby operation mode as shown in FIG. 7C, the threshold voltage $V_T$ of a pMOS transistor which is cut off in the standby operation mode is set at a high level. When an output is of "H" level, at least one of the serially connected nMOS transistors has a high threshold voltage $V_T$.

In a NOR circuit, when an output is of "H" level in the standby operation mode as shown in FIG. 8A, the threshold voltage $V_T$ of an nMOS transistor which is cut off in the standby operation mode is set at a high value. In contrast, when an output is of "L" level in the standby operation mode as shown in FIGS. 8B and 8C, the threshold voltage $V_T$ of a pMOS transistor which is cut off in the standby operation mode is set at a high value. When an output is of "L" level, at least one of the serially connected pMOS transistors has a high threshold voltage $V_T$.

As described above, the present invention can be applied not only to an inverter but also to various types of LSI with the same effect as in a case of the inverter.

FIG. 9 is a diagram showing an example in which the first embodiment of the present invention is applied to a DRAM. In this example, when the DRAM is precharged with a voltage of $V_{CC}/2$ in the standby operation mode, since the source-drain voltage is 0 V, the threshold voltages of all the transistors can be low.

Figure 10:
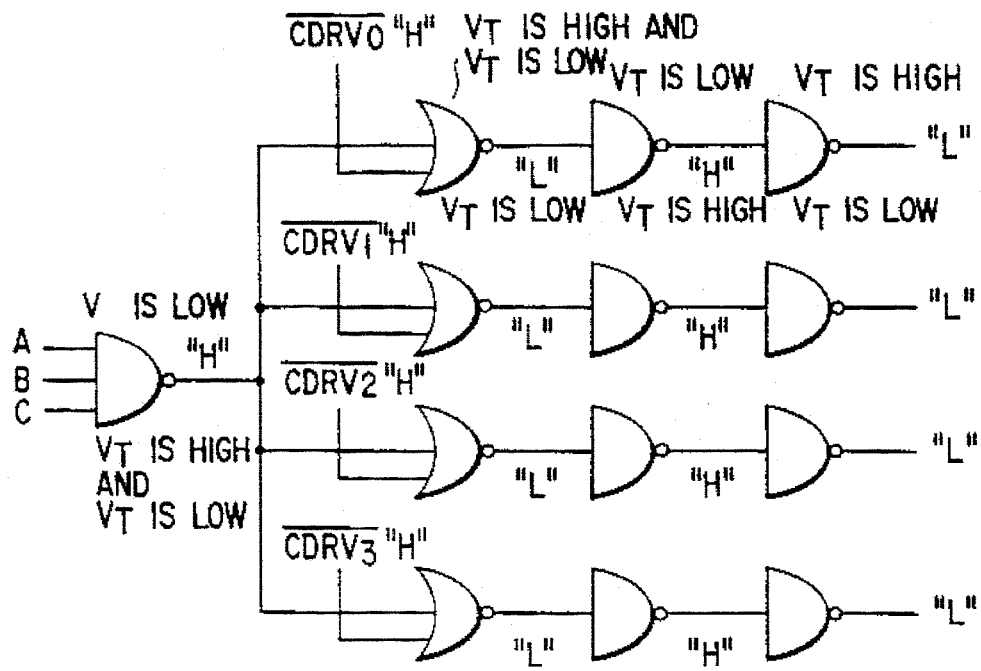
FIG. 10 is a diagram showing an example in which the first embodiment of the present invention is applied to a column decoder of a DRAM.

FIG. 10 is a diagram showing an example in which the first embodiment of the present invention is applied to a column decoder of a DRAM. With the constitution shown in FIG. 10, the operation speed can be increased by changing the values of the threshold voltage and the channel width W on the basis of the potentials of the nodes in the standby operations.

As described above, the present invention can be applied to a circuit in which the nodes are fixed in the standby operations. In addition, even if transistors of a low threshold voltage $V_T$ are used as both an nMOS and a pMOS in portions where the operation margin is narrow, the leak current of the entire device is not influenced. Thus, the present invention is effective in an operation for operating an overall chip with a low first voltage $V_{CC}$.

Figure 11:
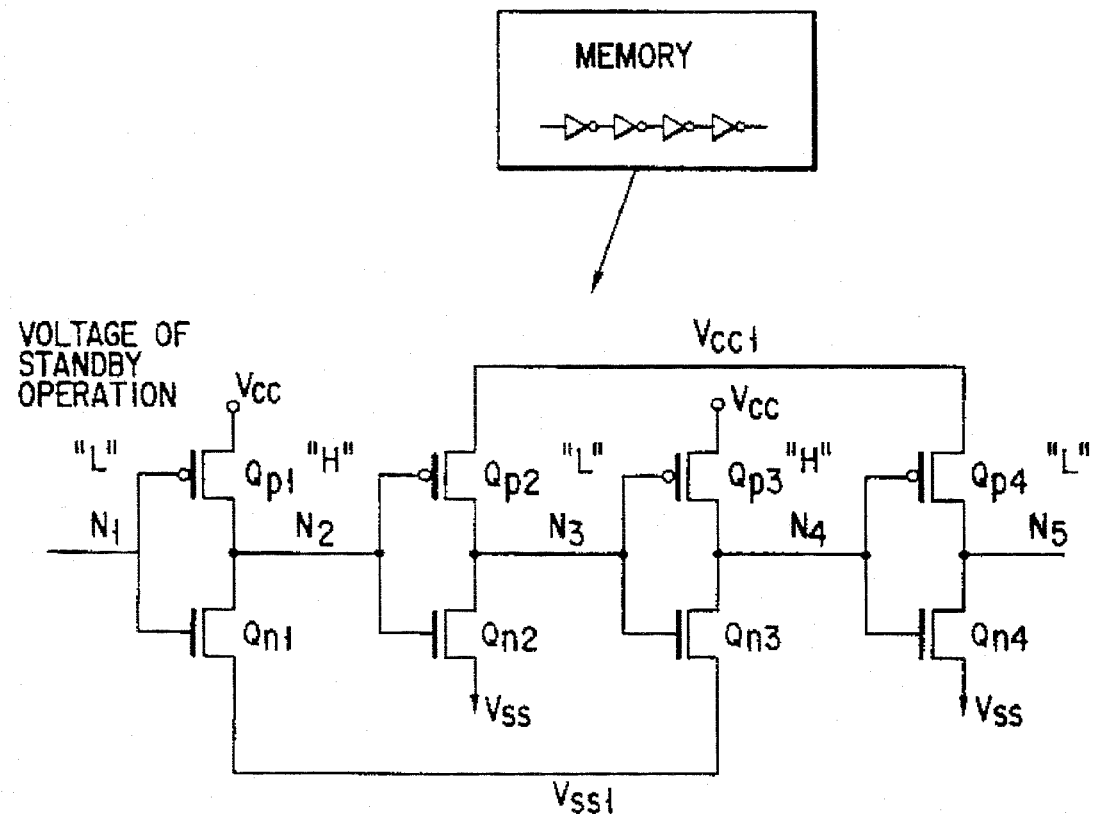
FIG. 11 is a diagram showing a logic gate of part of a memory circuit according to a second embodiment of the present invention.

FIG. 11 is a diagram showing a logic gate of part of a memory circuit according to a second embodiment of the present invention, i.e., four-stage inverter circuits.

The memory circuit has an active operation mode and a standby operation mode as shown in FIG. 2. In the standby operation mode, most of the circuits in a memory chip have constant values. In other words, the nodes are set at either an "H" level first voltage $V_{CC}$ or an "L" level second voltage $V_{SS}$.

In FIG. 11, nodes $N_1$, $N_3$ and $N_5$ are set at the "L" level and nodes $N_2$ and $N_4$ are set at the "H" level. In this state, according to the conventional art, there is a great difference between the potentials of the source and the drain in each of an nMOS constituted by transistors $Q_{n1}$ and $Q_{n3}$ and a pMOS constituted by transistors $Q_{p2}$ and $Q_{p4}$.

According to the second embodiment, the second voltage $V_{SS}$ of the transistors $Q_{n1}$ and $Q_{n2}$ is set at an internal control voltage $V_{SS1}$ and the first voltage $V_{CC}$ of the transistors $Q_{p2}$ and $Q_{p4}$ is set at an internal control voltage $V_{CC1}$. The second embodiment is featured in that the voltage $V_{CC1}$ is set at a level lower than the first voltage $V_{CC}$ and the voltage $V_{SS1}$ is set at a level higher than the second voltage $V_{SS}$ in the standby operation mode. By virtue of this feature, in a standby operation, since the gate-source voltage of the transistor $Q_{n1}$, for example, is $V_{SS}-V_{SS1}$ ($V_{SS1}>V_{SS}$), the value of $V_{SS}-V_{SS1}-V_T$ is smaller than the value of $-V_T$. Thus, even if the threshold voltage $V_T$ is the same as in a normal transistor, the cut-off characteristic can be greatly improved as compared to a transistor in which the gate-source voltage is 0 V.

Figure 12:
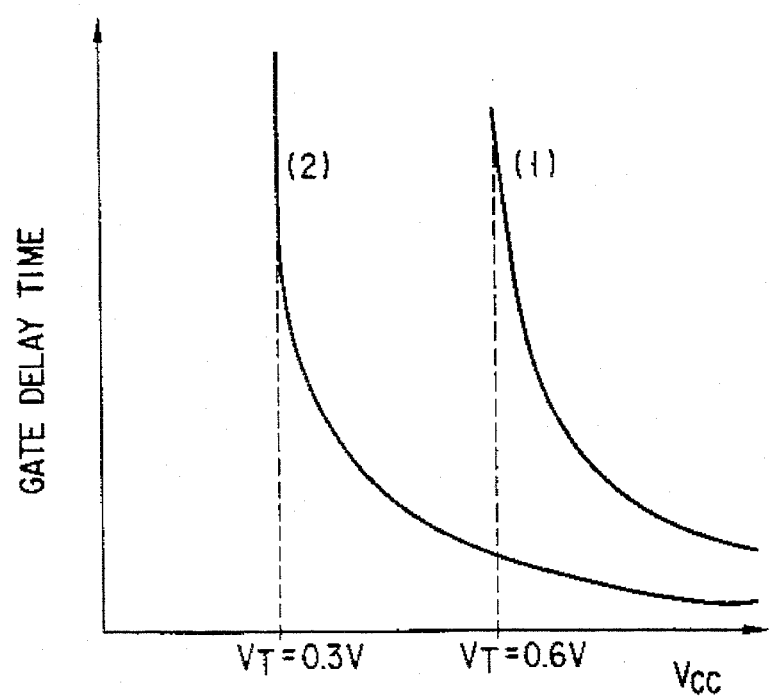
FIG. 12 is a diagram for explaining a gate delay time according to the second embodiment of the present invention.

For example, even when the threshold voltage $V_T$ is 0.3 V, the value of $V_{SS}-V_{SS1}-V_T$ is −0.6 V (−0.3−0.3), i.e., the same characteristic as in a conventional transistor in which the threshold voltage $V_T$ is 0.6 V is obtained. Consequently, since the threshold voltage of the entire circuit can be lowered, the gate delay time is greatly reduced as shown in FIG. 12 and an LSI can be operated at the first voltage $V_{CC}$, which is lower than the conventional threshold voltage $V_T$. Further, the standby current can be suppressed as in the conventional device. Needless to say, in an active operation, the node potentials $V_{SS1}$ and $V_{CC1}$ are respectively returned to the source (first and second) potentials $V_{SS}$ and $V_{CC}$, in the same manner as in a normal LSI.

Figure 13A:
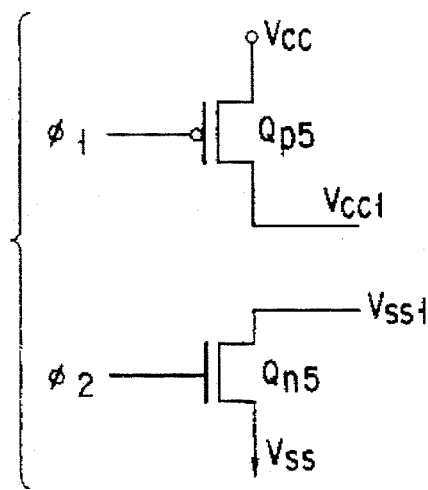
FIG. 13A is a diagram showing $V_{SS1}$ and $V_{CC1}$ generating circuits used in the second embodiment of the present invention.
Figure 13B:
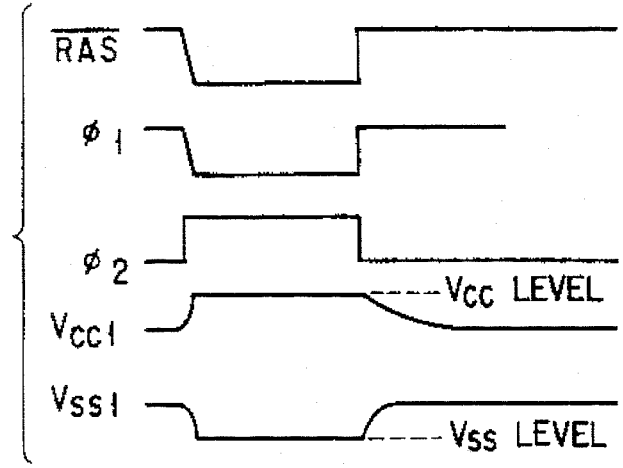
FIG. 13B is a diagram illustrating gate delay in the second embodiment of the present invention.

FIG. 13A is a diagram showing $V_{SS1}$ and $V_{CC1}$ generating circuits used in the second embodiment and FIG. 13B is a diagram illustrating signal waveforms in the circuits. As shown in FIG. 13B, clocks $\phi_1$ and $\phi_2$ are synchronized with a signal RAS. As a result, in the active operation, the value of $V_{CC1}$ is equal to that of $V_{CC}$ and the value of $V_{SS1}$ is equal to that of $V_{SS}$, and in the standby operation, the value of $V_{CC1}$ is smaller than that of $V_{CC}$ and the value of $V_{SS1}$ is greater than $V_{SS}$. Transistors $Q_{p5}$ and $Q_{n5}$ are turned off in response to the clocks $\phi_1$ and $\phi_2$ in the standby operation, thus automatically setting the voltages $V_{CC1}$ and $V_{SS1}$ to values lower than the first voltage $V_{CC}$ and greater than the second voltage $V_{SS}$.

Figure 14:
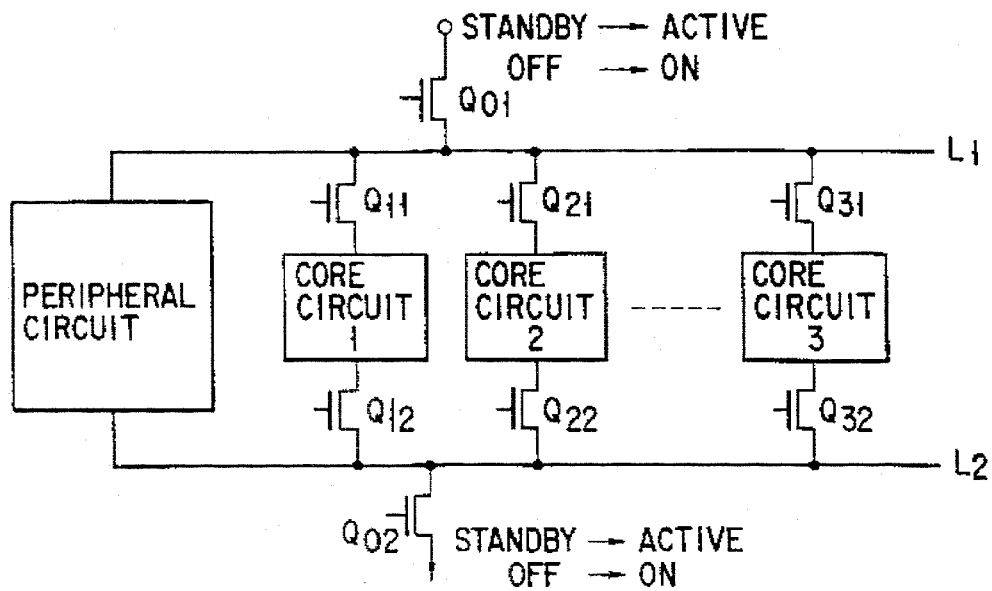
FIG. 14 is a schematic diagram of a memory circuit to which the second embodiment of the present invention is applied.

FIG. 14 is a schematic diagram of a memory circuit to which the second embodiment of the present invention is applied. A peripheral circuit, or an MOS transistor which is cut off in the standby operation mode, is connected to common lines $L_1$ and $L_2$. First terminals of pMOS transistors of core circuits, which are cut off in the standby operation mode, are connected to the common line $L_1$ through transistors $Q_{11}, Q_{21} \ldots, Q_{31}$. First terminals of nMOS transistors of core circuits, which are cut off in the standby operation mode, are connected to the common line $L_2$ through transistors $Q_{12}, Q_{22}, \ldots, Q_{32}$. The common line $L_1$ is connected to the first voltage $V_{CC}$ through a transistor $Q_{01}$ and the common line $L_2$ is connected to the second voltage $V_{SS}$ through a transistor $Q_{02}$.

In the standby operation, the transistors $Q_{01}$ and $Q_{02}$ are in an OFF state, the common line $L_1$ has a potential of $V_{CC1}$ and the common line $L_2$ has a potential of $V_{SS1}$. In the active operation, the transistors $Q_{01}$ and $Q_{02}$ are in an ON state, the common line $L_1$ has a potential of $V_{CC}$ and the common line $L_2$ has a potential of $V_{SS}$. Further, in the active operation, a core circuit 1, for example, has potentials of the first and second voltages $V_{CC}$ and $V_{SS}$, when the transistors $Q_{11}$ and $Q_{12}$ are in the ON state, and $V_{CC1}$ and $V_{SS1}$, when the transistors $Q_{11}$ and $Q_{12}$ are in the OFF state. Although not shown in FIG. 14, necessary portions of the peripheral circuit and the core circuits are connected to the first and second voltages $V_{CC}$ and $V_{SS}$.

In the above structure, since a number of core circuits are connected to the common lines $L_1$ and $L_2$, a large amount of driving current is required, when the standby operation mode is switched to the active operation mode, and vice versa. To overcome this problem, transistors $Q_{11}$ to $Q_{32}$ are interposed between each core circuit and the common line $L_1$ or $L_2$, so that only the transistor of a selected core circuit can be turned on or off.

According to the above structure, when the standby operation mode is switched to the active operation mode or the active operation mode is switched to the standby operation mode, the first and second voltages $V_{CC}$ and $V_{SS}$ of all the circuits need not be changed, but the source potentials of only part of the core circuits are changed. Therefore, the current consumption required for change the modes can be greatly reduced.

FIGS. 15A to 15C and FIGS. 16A to 16C are diagrams showing examples in which the second embodiment of the present invention is applied to a NAND circuit and a NOR circuit, respectively.

Figure 15A:
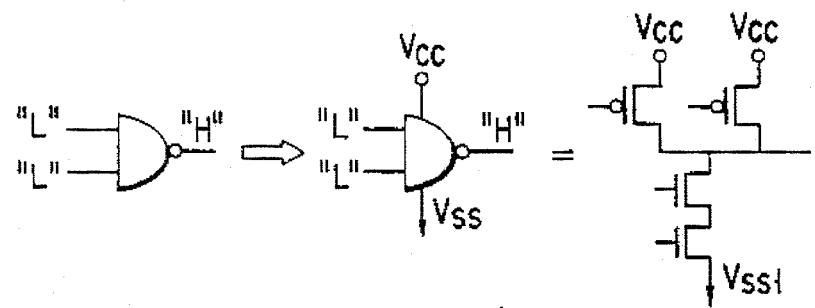
FIGS. 15A to 15C are diagrams showing an example in which the second embodiment of the present invention is applied to a NAND circuit.
Figure 15B:
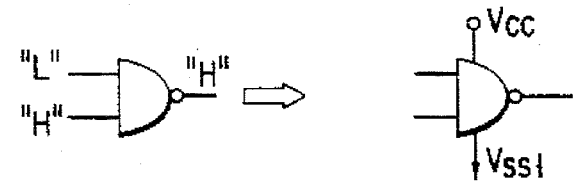
Figure 15C:
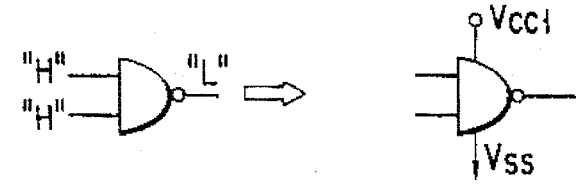

FIGS. 15A to 15C show usage of the voltages $V_{SS1}$ and $V_{CC1}$ at a fixed node in a NAND gate in a standby operation. FIG. 16A to 16C shows the same in a NOR gate. As shown in these drawings, the voltage $V_{SS1}$ is used instead of the second voltage $V_{SS}$, when the output is of "H" level in the standby operation, and the voltage $V_{CC1}$ is used instead of the first voltage $V_{CC}$, when the output is of "L" level in the standby operation. This applies to any other logic gate.

FIG. 17 is a diagram showing an example in which the second embodiment of the present invention is applied to a column decoder of a DRAM. In FIG. 17, the same components as shown in FIGS. 15 and 16 are identified with the same reference numerals as used in FIGS. 15 and 16. In the structure of FIG. 17 also, the same effect as in the structures of FIGS. 15 and 16 can be obtained in accordance with the rules as described above.

This invention is not limited to the first and second embodiments, but can be variously modified within the scope and spirit of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device having an active operation mode and a standby operation mode, said semiconductor device comprising:

a plurality of p-channel MOS transistors and n-channel MOS transistors, each having a source and a drain, one of the source and the drain of each of the p-channel MOS transistors and the n-channel transistors being fixed to one of potentials of "H" level and "L" level in the standby operation mode; wherein a threshold voltage of a first MOS transistor selected from the p-channel and the n-channel MOS transistors, which is cut off in the standby operation mode, at a value higher than a threshold voltage of a second MOS transistor selected from the p-channel and n-channel MOS transistors and being same channel as the first MOS transistor, the second MOS transistor being turned on in the standby operation mode.

2. The semiconductor device according to claim 1, wherein the first MOS transistor has a channel width greater than that of the second MOS transistor.

3. The semiconductor device according to claim 1, wherein:

at least one of the p-channel and the n-channel MOS transistors are connected in series; and when the MOS transistors connected in series are cut off in the standby operation mode, at least one of the MOS transistors connected in series is set at a high value.

4. The semiconductor device according to claim 3, wherein a circuit obtained by connecting the p-channel and n-channel MOS transistors constitutes at least one of a NOR circuit and a NAND circuit.

5. A semiconductor device having an active operation mode and a standby operation mode, said semiconductor device comprising:

a plurality of p-channel MOS transistors and n-channel MOS transistors, each having a source and a drain, one of the source and the drain of each of the p-channel MOS transistors and the n-channel transistors being fixed to one of potentials of "H" level and "L" level in the standby operation mode;

first means for lowering the voltage of a second power source connected to a p-channel MOS transistor which is cut off in the standby operation mode to a level lower than the voltage of a first power source connected to a p-channel MOS transistor which is kept on in the standby operation mode; and second means for raising the voltage of a fourth power source connected to an n-channel MOS transistor which is cut off in the standby operation mode to a level higher than the voltage of a third power source connected to an n-channel MOS transistor which is kept on in the standby operation mode.

6. The semiconductor device according to claim 5, further comprising means for maintaining a level of the voltage of the first power source and the voltage of the third power source in the standby operation mode.

7. The semiconductor device according to claim 5, wherein;
at least one of the p-channel and the n-channel MOS transistors are connected in series, thereby forming a serially-connected transistor circuit.

8. The semiconductor device according to claim 7, wherein the serially connected transistor circuit constitutes at least one of a NOR circuit and a NAND circuit.

9. The semiconductor device according to claim 5, further comprising:
a plurality of core circuits including a plurality of memory cells and circuits each constituted by p-channel and n-channel MOS transistors; and
means for maintaining a level of the voltages of the second power source and a fifth power source to the same potential as the voltages of the first and the third power sources in the active operation mode, respectively, in a core circuit which is selected in the active operation mode.

10. The semiconductor device according to claim 9, further comprising input means for inputting a signal from an external device of the semiconductor device, wherein a core circuit for setting the voltages of the second and the fourth power sources to the same level as those of the first and the third power sources in the active operation mode is selected by an address indicated by the signal input by the input means.

11. A semiconductor device according to claim 5, wherein said first means and said second means are controlled by an external row address strobe signal and a row address signal.

12. A semiconductor device according to claim 5, further comprising a memory cell array constituted by a plurality of memory cells.

13. A semiconductor device according to claim 12, further comprising a column address decoder for decoding a column address of said memory cell array.

14. A semiconductor device according to claim 13, wherein said second power source is connected to sources of p-channel MOS transistors each driving column selecting line of said memory cell array, and said third power source is connected to sources of n-channel MOS transistors each driving column selecting line of said memory cell array.

15. A semiconductor device according to claim 14, wherein said first means is controlled by a row address signal and a row address strobe signal.

16. The semiconductor device according to claim 5, wherein said first means is a p-channel transistor and said second means is an n-channel transistor.

17. A semiconductor device having an active operation mode and a standby operation mode, said semiconductor device comprising:
a plurality of p-channel MOS transistors and n-channel MOS transistors, each having a source and a drain, one of the source and the drain of the p-channel MOS transistors and the n-channel MOS transistor being fixed to one of potentials of "H" level and "L" level in the standby operation mode;
a plurality of first means for lowering a voltage of a second power source connected to a p-channel MOS transistor which is cut off in the standby operation mode to a level lower than a voltage of a first power source connected to a p-channel MOS transistor which is kept on in the standby operation mode; and
a plurality of second means for raising a voltage of a fourth power source connected to an n-channel MOS transistor which is cut off in the standby operation mode to a level higher than a voltage of a third power source connected to an n-channel MOS transistor which is kept on in the standby operation mode, wherein
a predetermined number of said first means and said second means are controlled by a row address strobe/ RAS, and others of said first means and said second means are controlled by a row address strobe/RAS and memory address signals.

18. A semiconductor device having an active operation mode and a standby operation mode, said semiconductor device comprising:
a plurality of sense amplifier circuits to sense memory cell data each comprising first p-channel MOS transistors cross coupled with first n-channel MOS transistors; and
a plurality of transistors for driving said plurality of sense amplifiers each comprising second p-channel MOS transistor and second n-channel MOS transistor, wherein
a threshold voltage of said first n-channel MOS transistor is lower than that of said second n-channel MOS transistor, and a threshold voltage of said first p-channel MOS transistor is lower than that of said second p-channel MOS transistor.

\* \* \* \* \*